(12) United States Patent
Suehiro (10) Patent No.: US 6,641,287 B2
(45) Date of Patent: Nov. 4, 2003

(54) REFLECTIVE TYPE LIGHT-EMITTING DIODE

(75) Inventor: Yoshinobu Suehiro, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/118,141

(22) Filed: Apr. 9, 2002

(65) Prior Publication Data

US 2002/0149942 A1 Oct. 17, 2002

(30) Foreign Application Priority Data

Apr. 11, 2001 (JP) ........................................ 2001-112456

(51) Int. Cl.⁷ ................................................ F21V 7/00
(52) U.S. Cl. ........................ 362/298; 362/346; 362/350; 362/800; 257/94; 257/98; 313/512
(58) Field of Search ................................. 362/298, 346, 362/350, 800; 313/512; 257/94, 98

(56) References Cited

U.S. PATENT DOCUMENTS

| | | | | |
|---|---|---|---|---|
| 4,013,915 A | * | 3/1977 | Dufft .......................... | 313/499 |
| 4,907,044 A | * | 3/1990 | Schellhorn et al. ........... | 257/98 |
| 5,623,181 A | * | 4/1997 | Suehiro et al. .............. | 313/512 |
| 5,865,529 A | * | 2/1999 | Yan .............................. | 362/327 |
| 6,345,903 B1 | * | 2/2002 | Koike et al. ................. | 362/249 |
| 6,459,130 B1 | * | 10/2002 | Arndt et al. ................. | 257/432 |

\* cited by examiner

*Primary Examiner*—Sandra O'Shea
*Assistant Examiner*—James W Cranson, Jr.
(74) *Attorney, Agent, or Firm*—McGinn & Gibb, PLLC

(57) ABSTRACT

In a light source of a reflective type LED, a light-emitting element is mounted on the bottom surface of a concave reflecting mirror. Accordingly, light emitted horizontally from the light-emitting surface of the light-emitting element is also reflected by the reflecting mirror, so that all components of light emitting from the light-emitting element are concentrated on a region within a predetermined extent from an axis perpendicular to the light-emitting surface so as to irradiate the region. Thus, the end portion of the reflecting mirror provided in opposition to the light source need not be made close to the height of the light-emitting surface of the light-emitting element 2 in the light source. Hence, it is possible to obtain high external radiating efficiency even in the case where the reflecting mirror is provided far from the light-emitting element. Thus, the degree of freedom for designing the reflecting mirror increases, so that the reflective type light-emitting diode can be widely applied.

7 Claims, 4 Drawing Sheets

REFLECTIVE TYPE LIGHT-EMITTING DIODE

The present application is based on Japanese Patent Application No. 2001-112456, which is incorporated herein by reference.

BACKGROUND OF THE INVENTION

1. Field of the Invention

The present invention relates to a reflective type light-emitting diode (hereinafter abbreviated as "reflective type LED") having a light source having a light-emitting element mounted on a lead forming a reflecting mirror, and a reflecting mirror provided in opposition to the light source. Incidentally, in this specification, an LED chip itself is referred to as "light-emitting element", an emitter including a resin package or an optical device such as a lens system having an LED chip mounted thereon is referred to as "light source", and a light-emitting device having a light source mounted thereon is generically referred to as "light-emitting diode" or "LED".

2. Description of the Related Art

Figure 4:
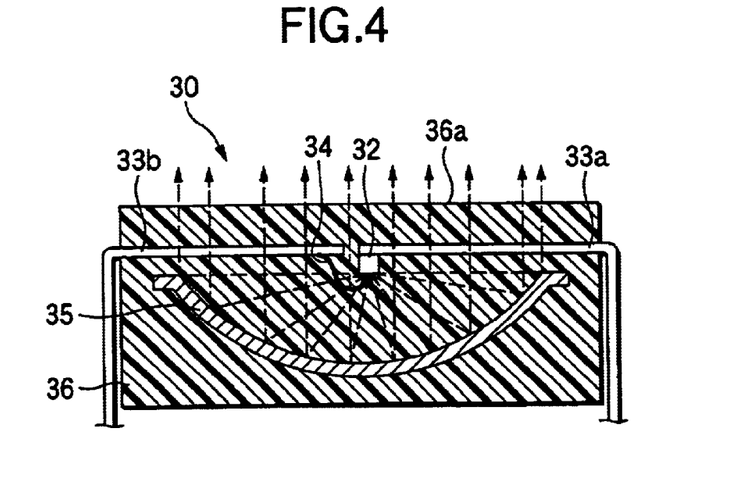
FIG. 4 is a vertically sectional view showing the overall configuration of a related-art reflective type LED.

An example of a related-art reflective type LED will be described below with reference to FIG. 4. FIG. 4 is a vertically sectional view showing the overall configuration of the related-art reflective type LED. As shown in FIG. 4, in the reflective type LED 30, a pair of leads 33a and 33b are provided for supplying electric power to a GaAs light-emitting element 32 which is mounted on one 33a of the leads 33a and 33b. The light-emitting element 32 and the other lead 33b are bonded to each other by a wire 34. A reflecting mirror 35 made from an aluminum sheet excellent in linear reflectance and pressed into a concave shape is disposed in opposition to a light-emitting surface of the light-emitting element 32. The light-emitting element 32, part of the pair of leads 33a and 33b, the wire 34 and the reflecting mirror 35 are sealed with a transparent epoxy resin 36. A light-radiating surface 36a is formed on a back surface side of the light-emitting element 32.

The reflecting mirror 35 has a reflecting surface formed as a paraboloid of revolution with the light-emitting element 32 as a focal point. Accordingly, all components of light emitted from the light-emitting element 32 and reflected by the reflecting mirror 35 are reflected in a direction parallel to the axis of the paraboloid of revolution and radiated from the light-radiating surface 36a to the outside. In such a manner, the reflective type LED 30 is configured with high external radiating efficiency.

In the reflective type LED 30, however, the reflecting mirror 35 needs to have a solid angle of about $2\pi$ steradian to the light-emitting element to keep the external radiating efficiency high. That is, the reflecting mirror 35 must be formed to have an end portion reaching the height of the light-emitting surface of the light-emitting element 32 in order to reflect light radiated substantially horizontally from the light-emitting surface of the light-emitting element 32. Therefore, the reflecting mirror 35 has to be disposed closely to the light-emitting element 32. There arises a problem that the degree of freedom for designing the reflecting mirror 35 is restricted.

SUMMARY OF THE INVENTION

It is therefore an object of the present invention to provide a reflective type light-emitting diode in which high external radiating efficiency can be obtained to increase the degree of freedom for designing a reflection mirror even in the case where an end portion of a reflecting mirror does not reach the height of a light-emitting surface of a light-emitting element.

(1) According to the invention, there is provided a reflective type light-emitting diode having: a light source including a light-emitting element, leads for supplying electric power to the light-emitting element, and a concave reflecting mirror provided around the light-emitting element; and a reflecting mirror provided in opposition to the light source.

In the reflective type LED configured as described above, the concave reflecting mirror is provided around the light-emitting element of the light source. Hence, light emitted from a light-emitting surface of the light-emitting element is not diffused horizontally but concentrated on a region within a predetermined extent from an axis perpendicular to the light-emitting surface. For this reason, all the reflecting mirror provided in opposition to the light source has to do is to reflect light irradiating the region within the predetermined extent from the axis perpendicular to the light-emitting surface. Hence, the end portion of the reflecting mirror need not reach the height of the light-emitting surface, so that the degree of freedom for designing the reflecting mirror can be increased while the reflecting mirror can be disposed to be far from the light source. Moreover, all components of light radiated from the light source can be substantially reflected by the reflecting mirror so as to be radiated to the outside with high external radiating efficiency.

In such a manner, there is provided a reflective type LED in which high external radiating efficiency can be obtained to increase the degree of freedom for designing the reflecting mirror even in the case where the end portion of the reflecting mirror does not reach the height of the light-emitting surface of the light-emitting element.

(2) According to the invention, there is provided a reflective type light-emitting diode of the configuration as defined in (1), wherein the reflecting mirror provided in opposition to the light source has a solid angle of not higher than $1.65\pi$ steradian to the light source.

As described above, the concave reflecting mirror is provided around the light-emitting element of the light source. Hence, light emitted from the light-emitting surface of the light-emitting element is not diffused horizontally but concentrated on a region within an extent of about 80 degrees from an axis perpendicular to the light-emitting surface. For this reason, all the reflecting mirror provided in opposition to the light source has to do is to reflect light irradiating the region within the extent of about 80 degrees from the axis perpendicular the light-emitting surface. This extent of about 80 degrees corresponds to a solid angle of about $1.65\pi$ steradian. Hence, the reflecting mirror may have a solid angle of not higher than $1.65\pi$ steradian. Accordingly, the end portion of the reflecting mirror need not reach the height of the light emitting surface, so that the degree of freedom for designing the reflecting mirror can be increased while the reflecting mirror can be disposed to be far from the light source. Moreover, all components of light radiated from the light source can be substantially reflected by the reflecting mirror so as to be radiated to the outside with high external radiating efficiency.

In such a manner, there is provided a reflective type LED in which high external radiating efficiency can be obtained to increase the degree of freedom fort designing the reflecting mirror even in the case where the end portion of the reflecting mirror does not reach the height of the light-emitting surface of the light-emitting element.

(3) According to the invention, there is provided a reflective type light-emitting diode of the configuration as defined in (1) or (2), wherein the light source further includes a light-transmissive material for sealing the light-emitting element, part of the leads and the concave reflecting mirror and for forming a light-radiating surface on the light-emitting surface side of the light-emitting element.

In the reflective type LED configured as described above, the light-emitting element is sealed with the light-transmissive material, so that the light quantity emitted from the light-emitting element becomes about twice as large as that in the case where the light-emitting element is not sealed. As a result, the luminous intensity of the light source and, accordingly, the luminous intensity of the reflective type LED increase greatly. In addition, the light-radiating surface is formed on the light-emitting surface side of the light-emitting element, so that light emitted from the light-emitting element having an irradiation range limited by the concave reflecting mirror provided around the light-emitting element can be further controlled to limit the irradiation range. Accordingly, the degree of freedom for designing the reflecting mirror provided in opposition to the light source can be increased more greatly.

In such a manner, there is provided a reflective type LED in which the luminous intensity increases greatly while the degree of freedom for designing the reflecting mirror can be increased more greatly.

(4) According to the invention, there is provided a reflective type light-emitting diode of the configuration as defined in (3), wherein the light-radiating surface forms a convex lens.

In the reflective type LED configured as described above, the convex lens is formed on the light-emitting surface side of the light-emitting element. Hence, light emitted from the light-emitting element having an irradiation range limited by the concave reflecting mirror can be further condensed to narrow the irradiation range. Accordingly, the end portion of the reflecting mirror provided in opposition to the light source can be made farther from the light-emitting surface of the light-emitting element, so that the degree of freedom for designing the reflecting mirror can be increased more greatly.

In such a manner, there is provided a reflective type LED in which the range of irradiation with light from the light source can be made narrower to increase the degree of freedom for designing the reflecting mirror more greatly.

(5) According to the invention, there is provided a reflective type light-emitting diode of the configuration as defined in (3) or (4), wherein the light-radiating surface is shaped like an ellipsoidal convex lens having a top portion truncated into a flat surface.

In the configuration, among all components of light emitted from the light-emitting element having an irradiation range limited within the predetermined extent from the axis perpendicular to the light-emitting surface by the concave reflecting mirror, light components in the central portion around the axis perpendicular to the light-emitting surface are not radiated straightly as they are, but refracted outward and radiated obliquely. Accordingly, the central portion of the reflecting mirror disposed in opposition to the light source is scarcely irradiated with light. The light reflected from the central portion of the reflecting mirror is, however, blocked by the light source opposite to the reflecting mirror, so as not to be allowed to go out. Hence, wasteful light hitting on the central portion of the reflecting mirror can be substantially eliminated, so that light emitted from the light-emitting element can be reflected more effectively to improve the external radiating efficiency more greatly. In addition, even in the case where the size of the reflective type LED is reduced as a whole in this configuration, the external radiating efficiency can be kept high because the central portion of the reflecting mirror is scarcely irradiated with light. Hence, the size of the reflective type LED can be reduced.

In such a manner, there is provided a reflective type LED in which the degree of freedom for designing the reflecting mirror can be increased while greater improvement of external radiating efficiency and reduction in size can be achieved.

(6) According to the invention, there is provided a reflective type light emitting diode of the configuration as defined in anyone of (1) to (5), further having a light-shielding member including a light-transmission hole, wherein the reflecting mirror provided in opposition to the light source condenses light from the light source into the light-transmission hole of the light-shielding member so that the condensed light is radiated to the outside through the light-transmission hole.

Here, the "light-transmission hole" maybe a through-hole or a hole filled with a light-transmissive material.

The reflective type LED according to the invention is a so-called light-shielding reflective type LED. The "light-shielding reflective type LED" means a reflective type LED in which the size of a light-transmission hole provided in a light-shielding member is made the required smallest to prevent lowering of contrast between light at the time of turning on the light source and shade at the time of turning off the light source from being caused by external light which goes out again because the external light passes through the light-transmission hole and is reflected by the reflecting mirror. It is therefore necessary to form the reflecting surface of the reflecting mirror into a special shape in order to reflect and condense light from the light source efficiently to make the light pass through the light-transmission hole formed to have the required smallest size. Examples of the special shape of the reflecting surface include: a shape of an aggregate of parts of a plurality of spheroids each with the light source and the light-transmission hole as its focal points; and a shape in which a part of an ellipse with the light source and the light-transmission hole as its focal points is rotated around a central axis of the ellipse.

In the reflective type LED according to the invention, however, the concave reflecting mirror is provided around the light-emitting element to thereby increase the degree of freedom for designing the reflecting mirror provided in opposition to the light source. Hence, the reflective type LED can be provided as a light-shielding reflective type LED having high external radiating efficiency. Moreover, in the reflective type LED according to the invention, the reflecting mirror can be provided to be far from the light source, so that the directivity of light radiated from the light-transmission hole can be enhanced without any change of the positional relation between the light source and the light-transmission hole. Hence, the resulting light can be controlled easily by a secondary optical system provided on the outside, so that the reflective type LED can be formed as a light-shielding reflective type LED which is widely applicable.

In such a manner, there is provided a reflective type LED in which the directivity of light radiated from the light-transmission hole can be enhanced as well as the external radiating efficiency is high also as a light-shielding reflective type LED.

Features and advantages of the invention will be evident from the following detailed description of the preferred embodiments described in conjunction with the attached drawings.

DETAILED DESCRIPTION OF THE PREFERRED EMBODIMENTS

Embodiments of the invention will be described below with reference to the drawings.

Embodiment 1

Figure 1A:
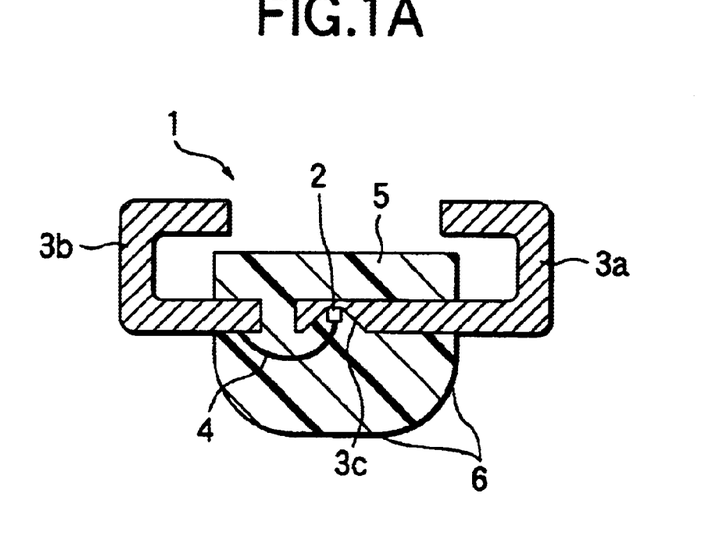
FIGS. 1A and 1B are a vertically sectional view and a bottom view showing the configuration of a light source of a reflective type light-emitting diode according to Embodiment 1 of the invention.
Figure 1B:
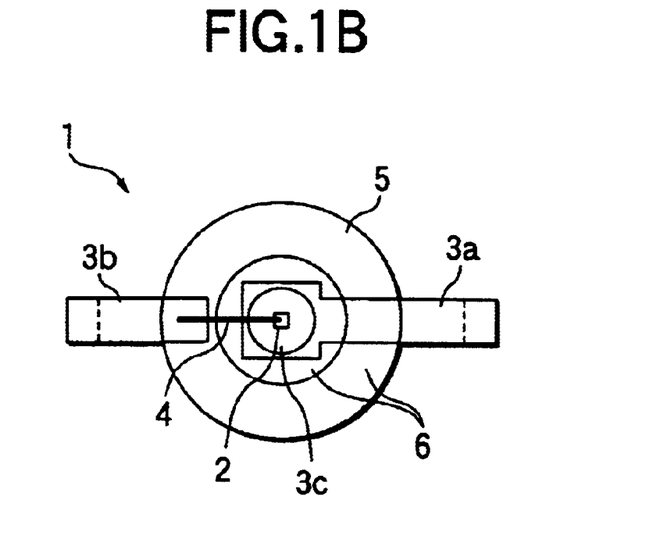
Figure 2A:
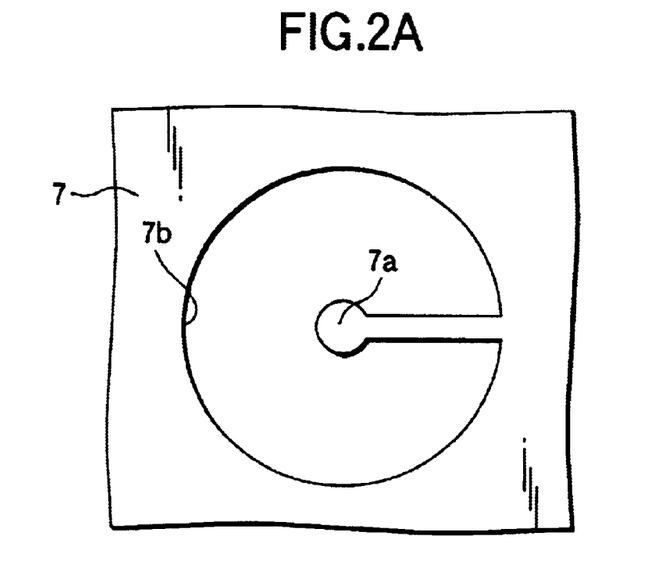
FIGS. 2A and 2B are a plan view and a vertically sectional view showing the overall configuration of the reflective type light-emitting diode according to Embodiment 1 of the invention.
Figure 2B:
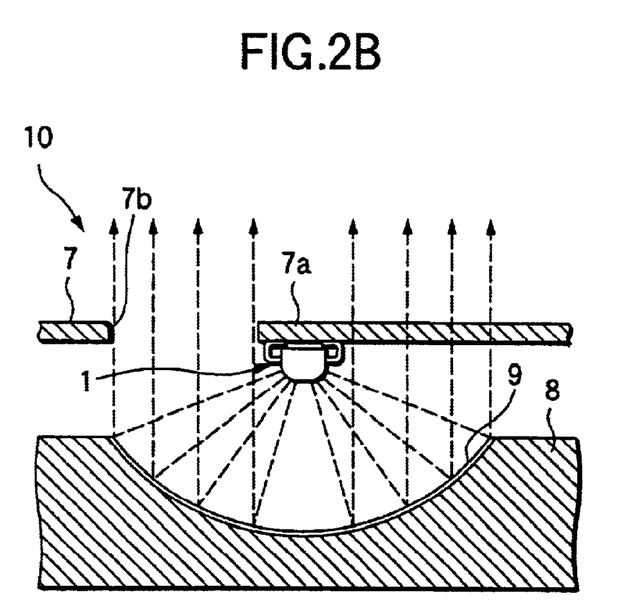

Embodiment 1 of the invention will be described first with reference to FIGS. 1A, 1B, 2A and 2B. FIG. 1A is a vertically sectional view showing the configuration of a light source in a reflective type light-emitting diode according to Embodiment 1 of the invention. FIG. 1B is a bottom view showing the configuration of the light source. FIG. 2A is a plan view showing the overall configuration of the reflective type light-emitting diode according to Embodiment 1 of the invention. FIG. 2B is a vertically sectional view showing the overall configuration of the reflective type light-emitting diode.

As shown in FIGS. 1A and 1B, the light source 1 in the reflective type LED according to Embodiment 1 includes a light-emitting element 2, a pair of leads 3a and 3b for supplying electric power to the light-emitting element 2, and a concave reflecting mirror 3c provided on one 3a of the leads 3a and 3b. The light-emitting element 2 is mounted on a bottom surface of the concave reflecting mirror 3c by silver paste. An electrode on a surface of the light-emitting element 2 and the other 3b of the leads 3a and 3b are bonded to each other by a wire 4. The light-emitting element 2, part of the pair of leads 3a and 3b, the concave reflecting mirror 3c and the wire 4 are sealed with a transparent epoxy resin 5 as a light transmissive material. A light-radiating surface (convex lens) 6 is formed on the light-emitting surface side of the light-emitting element 2. A lower half of the convex lens 6 is shaped like an ellipsoid having a top portion truncated into a flat surface. In addition, outside the epoxy resin 5, the pair of leads 3a and 3b are bent substantially perpendicularly twice so as to be mountable on a substrate.

In the light source 1 configured as described above, the light-emitting element 2 is mounted on the bottom surface of the concave reflecting mirror 3c. Hence, light emitted horizontally from the light-emitting surface of the light-emitting element 2 is also reflected by the reflecting mirror 3c so that all components of light emitted from the light-emitting element 2 are concentrated on a region within a predetermined extent of about 80 degrees from an axis perpendicular to the light emitting surface. In addition, the convex lens 6 sealing the light source 1 is shaped like an ellipsoid having a top portion truncated into a flat surface. Hence, light emitted to a portion around the central axis perpendicular to the light-emitting surface of the light-emitting element 2 is refracted and radiated outward through this flat surface. As a result, there is little light radiated onto a portion just under the light source 1. Moreover, the light-emitting element 2 is sealed with the transparent epoxy resin 5 as a light-transmissive material. Hence, the light quantity radiated from the light-emitting element 2 becomes about twice as large as that in the case where the light-emitting element 2 is not sealed. Accordingly, the luminous intensity of the light source 1 increases too.

As shown in FIGS. 2A and 2B, a light-transmission hole 7b circularly shaped is formed in a mount substrate 7 and a mount portion 7a is protrusively provided in the central portion of the light-transmission hole 7b. The light source 1 having the properties is mounted by soldering on a lower surface of the mount portion 7a. Further, a reflecting substrate 8 having a reflecting mirror 9 formed by deposition of aluminum vapor on a concave surface of a polycarbonate resin is disposed in a position distant from the mount substrate 7. In this manner, the reflective type LED 10 according to Embodiment 1 is configured.

The reflecting mirror 9 is formed on a paraboloid of revolution with the light source 1 as its focal point. An end portion of the reflecting mirror 9 is set to have a height (with a solid angle of about $1.65\pi$ steradian to the light source 1) enough to reflect all light components concentratedly irradiating a region within a predetermined extent from an axis perpendicular to the light-emitting surface of the light-emitting element 2. Incidentally, because there is little light radiated just under the light source 1, the central portion of the reflecting mirror 9 from which light is reflected and where the light is blocked by the light source 1 is scarcely irradiated with light. As a result, all the light components radiated from the light source 1 are reflected by the reflecting mirror 9, so that all the light components are substantially radiated to the outside through the light-transmission hole 7b in a direction parallel to the rotation axis of the paraboloid of revolution, that is, just above the reflecting mirror 9. Hence, the reflective type LED 10 can be formed as a reflective type LED in which very high external radiating efficiency is obtained.

Even in the case where the size of the reflective type LED is reduced as a whole in this configuration, the external radiating efficiency can be kept very high because the portion just under the light source 1 is scarcely irradiated with light. For this reason, the reflective type LED can be further miniaturized. In addition, since light from the light-emitting element 2 concentratedly irradiates a region within a predetermined extent from an axis perpendicular to the light-emitting surface, it is unnecessary to make the end portion of the reflecting mirror 9 close to the height of the light-emitting surface of the light-emitting element 2. Hence, it is possible to provide the reflecting mirror 9 far both from the light-emitting element 2 and from the mount substrate 7. Hence, the degree of freedom for designing the reflecting mirror 9 increases so that the reflective type LED can be widely applied.

Although Embodiment 1 has been described upon the case where the concave reflecting mirror 3c of the light source 1 is provided so that light emitted from the light-emitting element 2 concentratedly irradiates a region within an extent of about 80 degrees from an axis perpendicular to the light-emitting surface of the light-emitting element 2, the effect that the reflecting mirror 9 can be irradiated with light radiated from the side surface of the light-emitting element 2 toward the back surface of the light-emitting element 2 can be obtained also in the case where light concentratedly irradiates a region within an extent of 90 degrees. On the contrary, when the angle of the irradiated region is made narrower, the degree of freedom for designing the reflecting mirror 9 can be increased so greatly that a sufficient effect can be obtained even in the case where light irradiates a region within an extent of about 70 degrees (with a solid angle of about $1.3\pi$ steradian to the light source 1).

Embodiment 2

Figure 3A:
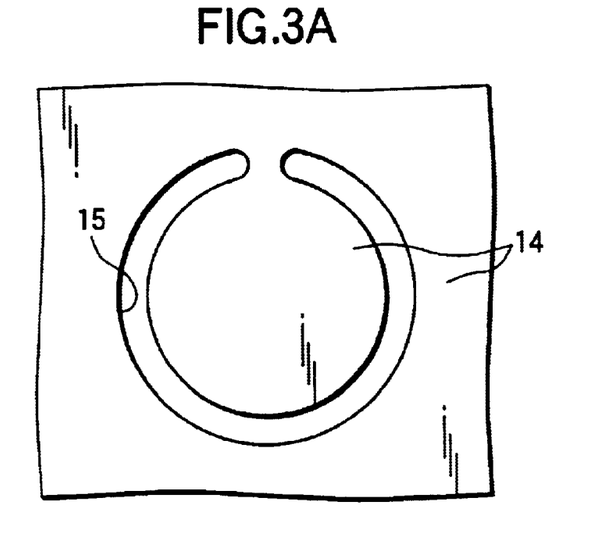
FIGS. 3A and 3B are a plan view and a vertically sectional view showing the overall configuration of a reflective type light-emitting diode according to Embodiment 2 of the invention.
Figure 3B:
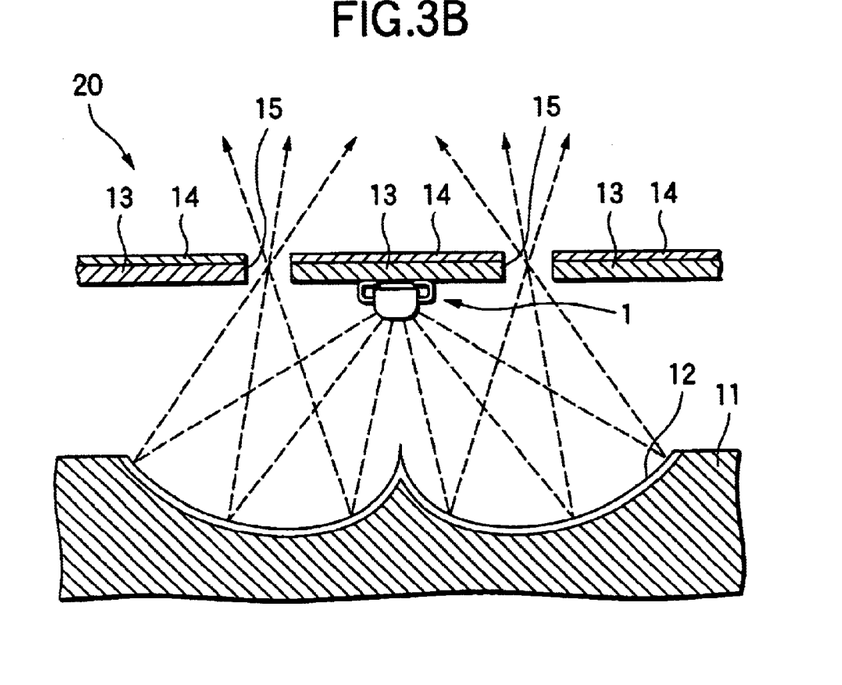

Next, Embodiment 2 of the invention will be described with reference to FIGS. 3A and 3B. FIGS. 3A and 3B are a plan view and a vertically sectional view showing the overall configuration of a reflective type light-emitting diode according to Embodiment 2 of the invention.

As shown in FIGS. 3A and 3B, the reflective type LED 20 according to Embodiment 2 is a light-shielding reflective type LED. That is, a black shield plate 14 is laid over a mount substrate 13 having a light source 1 mounted thereon in a similar manner to that in Embodiment 1. A light-transmission hole 15 provided in a shielding member constituted by the mount substrate 13 and the shield plate 14 has a C-shape which is narrow in width and substantially circular around the light source 1 in view from above as shown in FIG. 3A. A reflecting substrate 11 containing a reflecting mirror 12 formed by deposition of aluminum 12 vapor on a concave surface of a polycarbonate resin is disposed in a position distant from the mount substrate 13 and the shield plate 14 so as to be opposite to the light source 1. In such a manner, the reflective type LED 20 according to Embodiment 2 is configured.

The reflecting surface of the reflecting mirror 12 has a shape in which a part of an ellipse with the light source 1 and the light-transmission hole 15 as its focal points is rotated around the central axis of the light source 1. Accordingly, all components of light emitted from the light source 1 and reflected from the reflecting surface of the reflecting mirror 12 are condensed into the light-transmission hole 15 and radiated to the outside through the light-transmission hole 15. In this manner, the reflective type LED 20 according to Embodiment 2 is formed as a light-shielding reflective type LED having very high external radiating efficiency. In addition, all components of light coming from the outside through the light-transmission hole 15 at the time of turning off the light source 1 are reflected by the reflecting mirror 12 so as to reach the light source 1 and be absorbed therein. In this manner, the reflective type LED 20 according to Embodiment 2 is formed as a light-shielding reflective type LED which is high in contrast between light at the time of turning on the light source 1 and shade at the time of turning off the light source 1.

Further, light emitted from the light-emitting element 2 of the light source 1 is concentrated on a region within an extent of about 80 degrees (with a solid angle of about $1.65\pi$ steradian to the light source 1) from an axis perpendicular to the light-emitting surface. Hence, it is possible to provide the reflecting mirror 12 far from the light source 1. In a light-shielding reflective type LED, it is necessary to radiate reflected light to the outside through the light-transmission hole 15. It is therefore necessary to provide the light-transmission hole 15 far from the reflecting mirror 12 in order to narrow the angle of beam spread. According to this embodiment, however, the directivity of light radiated from the light-transmission hole 15 can be enhanced without any change of the positional relation between the light source 1 and the light-transmission hole 15. Moreover, an optical system may be provided in the light-transmission hole 15 so that the distribution of light can be adjusted. In this case, it is easier to control the distribution of light if the light has higher directivity. In this manner, the reflective type LED 20 according to Embodiment 2 is formed as a light-shielding reflective type LED which can be widely applied.

Although Embodiment 2 has been described upon the case where the reflecting mirror 12 is provided far from the light source 1, the invention may be applied also to the case where the reflecting mirror 12 has a solid angle of $2\pi$ steradian to the light source 1. Since light emitted from the light-emitting element 2 of the light source 1 is concentrated on a region within an extent of about 80 degrees from an axis perpendicularly to the light-emitting surface so as to irradiate the region (but not irradiate the portion around the reflecting mirror), the directivity of light radiated from the light-transmission hole 15 can be enhanced.

Although Embodiment 2 has been also described upon the case where the light-transmission hole 15 is formed into a substantially circular shape around the light source 1 while the reflecting surface of the reflecting mirror 12 is formed into a shape in which a part of an ellipse with the light source 1 and the light-transmission hole 15 as its focal points is rotated around the central axis of the light source 1, various other configurations may be made as light-shielding reflective type LEDs. For example, a configuration may be made so that six light-transmission holes are placed in respective vertices of a hexagon around a light source as its center while a reflecting surface of a reflecting mirror is formed as an aggregate of parts of six spheroids with the light source and the six light-transmission holes as their focal points respectively.

Although the respective embodiments have been described upon the case where the light-emitting element and part of the leads are sealed with a transparent epoxy resin as a light-transmissive material, resin sealing need not be provided if a concave reflecting mirror can be provided around the light-emitting element. The lead used for mounting the light-emitting element need not be made of a metal lead frame. For example, the lead may be a circuit pattern formed on a glass epoxy circuit board or the like. Although description has been made upon the case where the light-radiating surface made of a transparent epoxy resin forms a convex lens, the invention maybe applied also to the case where the light-radiating surface may form any one of various other shapes such as a flat surface or a semispherical surface with the light-emitting element as its origin.

Although the respective embodiments have been also described upon the case where a transparent epoxy resin is used as the light-transmissive material of the sealing material, any light-transmissive material such as a transparent silicon resin may be used so long as the material can satisfy conditions of fluidity before curing, filling properties, transparency after curing, strength, and so on.

Although the respective embodiments have been described upon the case where the light-transmission hole 7b or 15 is formed as a through-hole, the invention may be applied also to the case where the light-transmission hole 7b or 15 is filled with a light-transmissive material such as a transparent epoxy resin.

The configuration, shape, quantity, material, size, connection relation, and so on, in the other portions of the reflective type light-emitting diode are not limited to those in the respective embodiments.

(1) As described above, the reflective type light-emitting diode according to the invention has: a light source including a light-emitting element, leads for supplying electric power to the light-emitting element, and a concave reflecting mirror provided around the light-emitting element; and a reflecting mirror provided in opposition to the light source.

In the reflective type LED configured as described above, the concave reflecting mirror is provided around the light-emitting element of the light source. Hence, light emitted from a light-emitting surface of the light-emitting element is not diffused horizontally but concentrated on a region within a predetermined extent from an axis perpendicular to the light-emitting surface. For this reason, all the reflecting mirror provided in opposition to the light source has to do is to reflect light irradiating the region within the predetermined extent from the axis perpendicular to the light-emitting surface. Hence, the end portion of the reflecting mirror need not reach the height of the light-emitting surface, so that the degree of freedom for designing the reflecting mirror can be increased while the reflecting mirror can be disposed to be far from the light source. Moreover, all components of light radiated from the light source can be substantially reflected by the reflecting mirror so as to be radiated to the outside with high external radiating efficiency.

In such a manner, there is provided a reflective type LED in which high external radiating efficiency can be obtained to increase the degree of freedom for designing the reflecting mirror even in the case where the end portion of the reflecting mirror does not reach the height of the light-emitting surface of the light-emitting element.

(2) The reflective type light-emitting diode according to the invention has the configuration as defined in (1), wherein the reflecting mirror provided in opposition to the light source has a solid angle of not higher than $1.65\pi$ steradian to the light source.

As described above, the concave reflecting mirror is provided around the light-emitting element of the light source. Hence, light emitted from the light-emitting surface of the light-emitting element is not diffused horizontally but concentrated on a region within an extent of about 80 degrees from an axis perpendicular to the light-emitting surface. For this reason, all the reflecting mirror provided in opposition to the light source has to do is to reflect light irradiating the region within the extent of about 80 degrees from the axis perpendicular the light-emitting surface. This extent of about 80 degrees corresponds to a solid angle of about $1.65\pi$ steradian. Hence, the reflecting mirror may have a solid angle of not higher than $1.65\pi$ steradian. Accordingly, in addition to the advantage as in (1), the end portion of the reflecting mirror need not reach the height of the light emitting surface, so that the degree of freedom for designing the reflecting mirror can be increased while the reflecting mirror can be disposed to be far from the light source. Moreover, all components of light radiated from the light source can be substantially reflected by the reflecting mirror so as to be radiated to the outside with high external radiating efficiency.

In such a manner, there is provided a reflective type LED in which high external radiating efficiency can be obtained to increase the degree of freedom fort designing the reflecting mirror even in the case where the end portion of the reflecting mirror does not reach the height of the light-emitting surface of the light-emitting element.

(3) The reflective type light-emitting diode according to the invention has the configuration as defined in (1) or (2), wherein the light source further includes a light-transmissive material for sealing the light-emitting element, part of the leads and the concave reflecting mirror and for forming a light-radiating surface on the light-emitting surface side of the light-emitting element.

In the reflective type LED configured as described above, in addition to the advantage as in (1) or (2), the light-emitting element is sealed with the light-transmissive material, so that the light quantity emitted from the light-emitting element becomes about twice as large as that in the case where the light-emitting element is not sealed. As a result, the luminous intensity of the light source and, accordingly, the luminous intensity of the reflective type LED increase greatly. In addition, the light-radiating surface is formed on the light-emitting surface side of the light-emitting element, so that light emitted from the light-emitting element having an irradiation range limited by the concave reflecting mirror provided around the light-emitting element can be further controlled to limit the irradiation range. Accordingly, the degree of freedom for designing the reflecting mirror provided in opposition to the light source can be increased more greatly.

In such a manner, there is provided a reflective type LED in which the luminous intensity increases greatly while the degree of freedom for designing the reflecting mirror can be increased more greatly.

(4) The reflective type light-emitting diode according to the invention has the configuration as defined in (3), wherein the light-radiating surface forms a convex lens.

In the reflective type LED configured as described above, the convex lens is formed on the light-emitting surface side of the light-emitting element. Hence, in addition to the advantage as in (3), light emitted from the light-emitting element having an irradiation range limited by the concave reflecting mirror can be further condensed to narrow the irradiation range. Accordingly, the end portion of the reflecting mirror provided in opposition to the light source can be made farther from the light-emitting surface of the light-emitting element, so that the degree of freedom for designing the reflecting mirror can be increased more greatly.

In such a manner, there is provided a reflective type LED in which the range of irradiation with light from the light source can be made narrower to increase the degree of freedom for designing the reflecting mirror more greatly.

(5) The reflective type light-emitting diode according to the invention has the configuration as defined in (3) or (4), wherein the light-radiating surface is shaped like an ellipsoidal convex lens having a top portion truncated into a flat surface.

Hence, in addition to the advantage as in (3) or (4), among all components of light emitted from the light-emitting element having an irradiation range limited within the predetermined extent from the axis perpendicular to the light-emitting surface by the concave reflecting mirror, light components in the central portion around the axis perpendicular to the light-emitting surface are not radiated straightly as they are, but refracted outward and radiated obliquely. Accordingly, the central portion of the reflecting mirror disposed in opposition to the light source is scarcely irradiated with light. The light reflected from the central portion of the reflecting mirror is, however, blocked by the light source opposite to the reflecting mirror, so as not to be allowed to go out. Hence, wasteful light hitting on the central portion of the reflecting mirror can be substantially eliminated, so that light emitted from the light-emitting element can be reflected more effectively to improve the external radiating efficiency more greatly. In addition, even in the case where the size of the reflective type LED is reduced as a whole in this configuration, the external radiating efficiency can be kept high because the central portion of the reflecting mirror is scarcely irradiated with light. Hence, the size of the reflective type LED can be reduced.

In such a manner, there is provided a reflective type LED in which the degree of freedom for designing the reflecting mirror can be increased while greater improvement of external radiating efficiency and reduction in size can be achieved.

(6) The reflective type light-emitting diode according to the invention has the configuration as defined in any one of (1) to (5), wherein the reflective type light-emitting diode further has a light-shielding member including a light-transmission hole, wherein the reflecting mirror provided in opposition to the light source condenses light from the light source into the light-transmission hole of the light-shielding member so that the condensed light is radiated to the outside through the light-transmission hole.

The reflective type LED according to the invention is a so-called light-shielding reflective type LED. The "light-shielding reflective type LED" means a reflective type LED in which the size of a light-transmission hole provided in a light-shielding member is made the required smallest to prevent lowering of contrast between light at the time of turning on the light source and shade at the time of turning off the light source from being caused by external light which goes out again because the external light passes through the light-transmission hole and is reflected by the reflecting mirror. It is therefore necessary to form the reflecting surface of the reflecting mirror into a special shape in order to reflect and condense light from the light source efficiently to make the light pass through the light-transmission hole formed to have the required smallest size. Examples of the special shape of the reflecting surface include: a shape of an aggregate of parts of a plurality of spheroids each with the light source and the light-transmission hole as its focal points; and a shape in which a part of an ellipse with the light source and the light-transmission hole as its focal points is rotated around a central axis of the ellipse.

In the reflective type LED according to the invention, however, the concave reflecting mirror is provided around the light-emitting element to thereby increase the degree of freedom for designing the reflecting mirror provided in opposition to the light source. Hence, in addition to the advantage as in any one of (1) to (5), the reflective type LED can be provided as a light-shielding reflective type LED having high external radiating efficiency. Moreover, in the reflective type LED according to the invention, the reflecting mirror can be provided to be far from the light source, so that the directivity of light radiated from the light-transmission hole can be enhanced without any change of the positional relation between the light source and the light-transmission hole. Hence, the resulting light can be controlled easily by a secondary optical system provided in the outside, so that the reflective type LED can be formed as a light-shielding reflective type LED which is widely applicable.

In such a manner, there is provided a reflective type LED in which the directivity of light radiated from the light-transmission hole can be enhanced as well as the external radiating efficiency is high also as a light-shielding reflective type LED.

This invention is not confined by any of the modes of the above-described embodiments of the invention and the explanation of the embodiments. This invention includes a variety of modifications that do not deviate from the description within the scope of the claims for patent and within the range of simple imagination of these inventors.

What is claimed is:

1. A reflective type light-emitting diode comprising:
    a light source including a light-emitting element, leads for supplying electric power to said light-emitting element, and a concave reflecting mirror provided around said light-emitting element; and
    a reflecting mirror provided in opposition to said light source.

2. A reflective type light-emitting diode according to claim 1, wherein said reflecting mirror provided in opposition to said light source has a solid angle of not higher than 1.65π steradian to said light source.

3. A reflective type light-emitting diode according to claim 1, wherein said light source further includes a light-transmissive material for sealing said light-emitting element, part of said leads and said concave reflecting mirror and for forming a light-radiating surface on a light-emitting surface side of said light-emitting element.

4. A reflective type light-emitting diode according to claim 3, wherein said light-radiating surface forms a convex lens.

5. A reflective type light-emitting diode according to claim 3, wherein said light-radiating surface is shaped like an ellipsoidal convex lens having a top portion truncated into a flat surface.

6. A reflective type light-emitting diode according to claim 1, further comprising a light-shielding member including a light-transmission hole, wherein said reflecting mirror provided in opposition to said light source condenses light from said light source into said light-transmission hole of said light-shielding member so that the light is radiated to the outside through said light-transmission hole.

7. A reflective type light-emitting diode according to claim 1, wherein said concave reflecting mirror is formed on one of said lead, and said light-emitting element is mounted on a bottom surface of said concave reflecting mirror.

* * * * *